United States Patent
Hong et al.

(10) Patent No.: US 6,396,745 B1
(45) Date of Patent: May 28, 2002

(54) VERTICAL TWO-TRANSISTOR FLASH MEMORY

(75) Inventors: Gary Hong; Hwi-Huang Chen, both of Hsin-Chu; Wen-Chi Ting, Taipei, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/783,868

(22) Filed: Feb. 15, 2001

(51) Int. Cl.$^7$ ................................................. G11C 7/00
(52) U.S. Cl. ......................... 365/185.28; 365/185.15; 365/185.05; 365/185.01; 365/174; 365/182
(58) Field of Search ................................ 365/174, 182, 365/185.01, 185.05, 185.15, 185.28

(56) References Cited

U.S. PATENT DOCUMENTS

| | | | | |
|---|---|---|---|---|
| 4,907,198 A | * | 3/1990 | Arima | 365/185.01 |
| 5,723,888 A | * | 3/1998 | Yu | 257/319 |
| 5,739,567 A | * | 4/1998 | Wong | 257/316 |
| 5,891,775 A | * | 4/1999 | Hisamune | 438/267 |
| 6,002,152 A | * | 12/1999 | Guterman et al. | 257/316 |
| 6,114,724 A | * | 9/2000 | Ratrakumar | 257/326 |
| 6,157,058 A | * | 12/2000 | Ogura | 257/315 |
| 6,201,732 B1 | * | 3/2001 | Caywood | 365/185.05 |

* cited by examiner

Primary Examiner—Viet Q. Nguyen
(74) Attorney, Agent, or Firm—Powell, Goldstein, Frazer & Murphy LLP

(57) ABSTRACT

In present invention we provide a vertical two-transistor memory cell consisted of a MOS transistor and an ETOX cell. One of the drain or source of the MOS transistor is connected to the control gate of the ETOX cell, the other is acted as the control gate of the vertical two-transistor memory cell and is connected to a control line. And the gate of the MOS transistor is acted as the select gate of the vertical two-transistor memory cell and is connected to a word line. The drain of ETOX cell is connected to a bit line, and the source of ETOX cell is grounded. The vertical two-transistor memory cell can be programmed by channel Fowler-Nordheim tunneling of electrons which is injected from the substrate through the channel and tunnel oxide into the floating gate. Such memory cell can avoid the word line disturb by controlling the word line. The memory cell can be also erased by channel Fowler-Nordheim tunneling, in which the electrons is withdrawn from the floating gate through the tunnel oxide and channel to the substrate. In addition, the vertical two-transistor memory cell can be also programmed by conventional methods such as hot electron injection and drain Fowler-Nordheim tunneling, and can be also erased by negative gate source erase or drain Fowler-Nordheim tunneling erase.

19 Claims, 6 Drawing Sheets

VERTICAL TWO-TRANSISTOR FLASH MEMORY

BACKGROUND

1. Field of the Invention

The present invention generally relates to a vertical two-transistor memory, and in particular to a vertical two-transistor memory which can avoid word line disturb and can be programmed or erased by channel Fowler-Nordheim tunneling of electrons.

2. Description of the Prior Art

The conventional erasable programmable read only memory (EPROM) cell 100 has two polysilicon gates as shown in FIG. 1A. The upper gate called control gain 101 is used for control and is connected to the word line. The bottom gate called floating gate 102 between the control gate 101 and the substrate 103 is isolated in the surrounding silicon dioxide. Programming of an EPROM cell 100 is achieved by applying a high voltage to both the drain 104 and the control gate 101 and grounding the source 105. Avalanche injection, also called hot electron injection (HEI), of high energy electrons then occurs from the substrate 103 through the isolating oxide 107 under the influence of the positive applied drain voltage. The electrons must gain sufficient energy to jump the 3.2 eV energy barrier at the interface between the silicon substrate 103 and the silicon dioxide 107. The positive voltage on the control gain then pulls the electrons through the oxide towards the floating gate 102 causing charge to be collected on the floating gate 102. The cell is erased through internal photoemission of electrons from the floating gate 102 to the control gate 101 and the substrate 103. This process can be achieved by exposing the EPROM to an ultra-violet (UV) light source.

An electrically erasable programmable read only memory (EEPROM) is a variation of the conventional EPROM design. EPROM tunnel oxide (ETOX) cell has been one of the most common EEPROM cells. The typical EEPROM 200, as shown in FIG. 2A, consists of two transistors: one is select transistor 210 and the other is storage transistor 220. The storage transistor 220 has an oxide region 223 between the floating gate 222 and the drain 225 where the oxide 223 is thin enough to permit Fowler-Nordheim tunneling (FN tunneling) to occur. So, the storage transistor 220 can be programmed or erased by Fowler-Nordheim tunneling of electrons through the thin oxide layer 223 between the floating gate 222 and the drain 225 of the storage transistor 220. In the write mode the control gate 221 is grounded and the drain 225 is connected to a high voltage through the select transistor 210. In the erase mode the control gate 221 is at the high voltage while the drain 225 is grounded. The equivalent circuit of EPROM is also shown in FIG. 1B.

Flash memories were a direct derivative of the one-transistor cell EPROM. They resulted from innovative cell designs and improved technology that allowed the one-transistor cell EPROM to be reprogrammed electrically in the system. The structure of a typical flash memory, as shown in FIG. 3A, is similar to an conventional EPROM but with thinner oxide 303 under the floating gate 302. Many of the flash memory cells that have been developed use the split gate concept in which the channel region 307 shared by the control gate 301 and the floating gate 302, as shown in FIG. 3A. Programming is usually by hot electron injection from the channel 307 near the drain 305 or the source 306, and erase is usually by cold electron tunneling through the thin oxide 303 between the floating gate 302 and the drain 305.

Two principal disturbs that can occur during programming of EPROM or flash memory are drain disturb and word line disturb.

In conventional programming of flash memory, a high voltage is applied to write data into memory cells, but is also withdrawing those electrons stored in other cells so that the data in which cells will be lost. As shown in FIG. 3B, in the programming of cell 12 a high voltage is applied to the bit line 1, and at the same time the cell 11 is also affected by such high voltage so that the electrons stored in cell 11 will be gradually lost from the drain. This effect is called drain disturb. When the word line 1 is applied with a high voltage to program the cell 21 or with a negative voltage to erase the cell 21, the data stored in cell 11 is also affected and then will be gradually lost from the gate. Such is called word line disturb.

To avoid those disturb, some control circuitry or peripherally protective circuitry may be introduced and positioned in front of the memory cells. One of prior methods for the drain disturb is using a select transistor connected to the drain of memory cell, it look just like an EEPROM. The equivalent circuit of this lateral two-transistor memory cell is shown in FIG. 2B. And a memory array constituted by such memory cell is also shown in FIG. 2C. In programming of the memory cell, the bit line 1 is applied with a high voltage to program the cell 11, at the same time the control line 1 and word line 1 are also applied with adequate voltages. To avoid affecting the cell 12, the word line 2 is no voltage, so the data stored in cell 12 can be preserved. As such, the lateral two-transistor memory cell can avoid the drain disturb. However, the memory cell provided in present invention is designed for the word line disturb.

SUMMARY

It is an object of the invention to provide a memory cell.

It is another object of the invention to provide a memory cell which can avoid the word line disturb.

It is a further object of the invention to provide a memory cell which can be programmed or erased by channel FN tunneling of electrons.

According to the foregoing objects, the present invention provides a vertical two-transistor memory cell structure which consists of a MOS transistor and an ETOX cell, wherein one of the drain and source of the MOS transistor is connected to the control gate of the ETOX cell, and the other is acted as the control gate of the vertical two-transistor memory cell and is connected to a control line. The gate of the MOS transistor is then acted as the select gate of the vertical two-transistor memory cell and is connected to a word line. The drain of the ETOX cell is connected to a bit line, and the source of the ETOX cell is grounded. We can call the MOS transistor a select transistor and the ETOX cell a storage transistor.

This vertical two-transistor memory cell can be programmed by channel FN tunneling. In the write mode the control gate and the select gate of the vertical two-transistor memory cell are applied with positively high voltage, the drain and source are grounded or floating, and the substrate is grounded, so the electrons can be pulled from the substrate through the channel and the tunnel oxide to the floating gate. Other memory cells connected to the same control line can avoid the effect of the high voltage of programming by using word lines to control the select gates, and then the data stored in those memory cell can be preserved. For this reason, we can say that the present vertical two-transistor memory cell can avoid the word line disturb. In addition, the electrons are injected through the overall channel unlike the conventional programming in which the electrons are injected from a partial region of channel near the drain. It is attributed to that the high voltage is applied to the control gate, but the drain and source are grounded.

The vertical two-transistor memory cell can also be erased by channel FN tunneling. In erase mode the select gate is applied an adequate voltage, the control gate is grounded, the source and drain are floating or applied with a voltage equal to the voltage of well, and the substrate is applied with a high voltage, so that the electrons stored in the floating gate can be withdrawn through the tunnel oxide and channel to the substrate.

In addition, the vertical two-transistor memory cell can be also programmed by conventional methods such as hot electron injection and drain FN tunneling, and can be also erased by negative gate source erase or drain FN tunneling erase.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 4A:
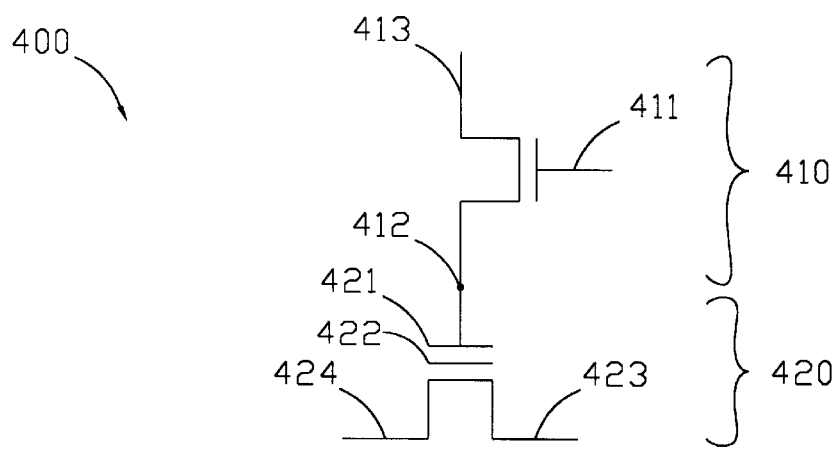
FIG. 4A shows an equivalent circuit diagram of the vertical two-transistor memory cell.

In the embodiment of present invention we provide a vertical two-transistor memory cell which can avoid the word line disturb, as shown in FIG. 4A. The memory cell 400 consists of an NMOS 410 and an ETOX cell 420, wherein one 412 of the drain and source of NMOS 410 is connected to the control gate 421 of the ETOX cell 420, and the other is acted as the control gate 413 of the memory cell 400 and is connected to a word line. The gate of the NMOS 410 is acted as the select gate 411 of the memory cell 400, and is connected to a word line. The drain 423 of the ETOX cell 420 is connected to a bit line, and the source 424 of the ETOX cell 420 is grounded. We can call the NMOS 410 a select transistor and the ETOX cell 420 a storage transistor.

Figure 4B:
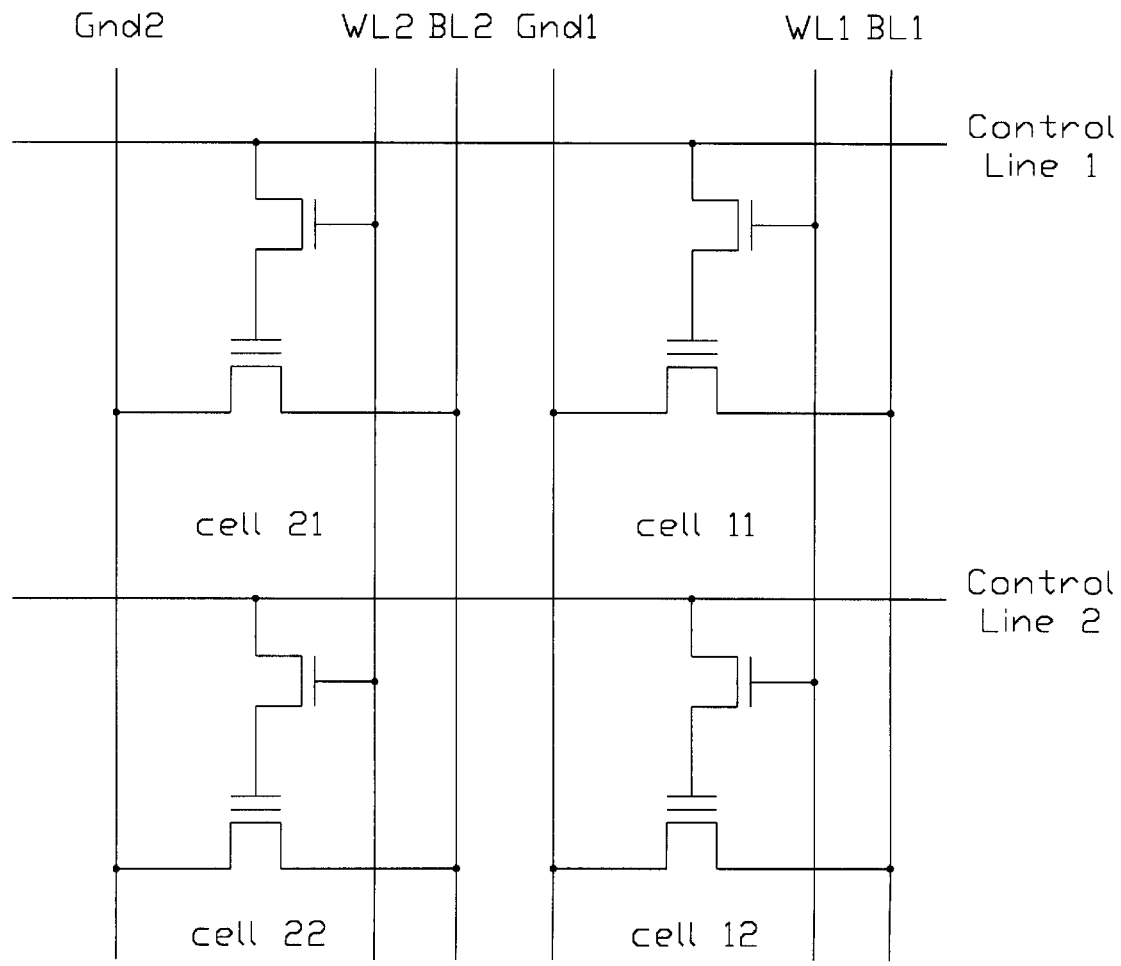
FIG. 4B shows an equivalent circuit diagram of the vertical two-transistor memory array.

FIG. 4B shows a memory array constituted by such memory cells 400, word lines, bit lines and control lines.

Figure 4C:
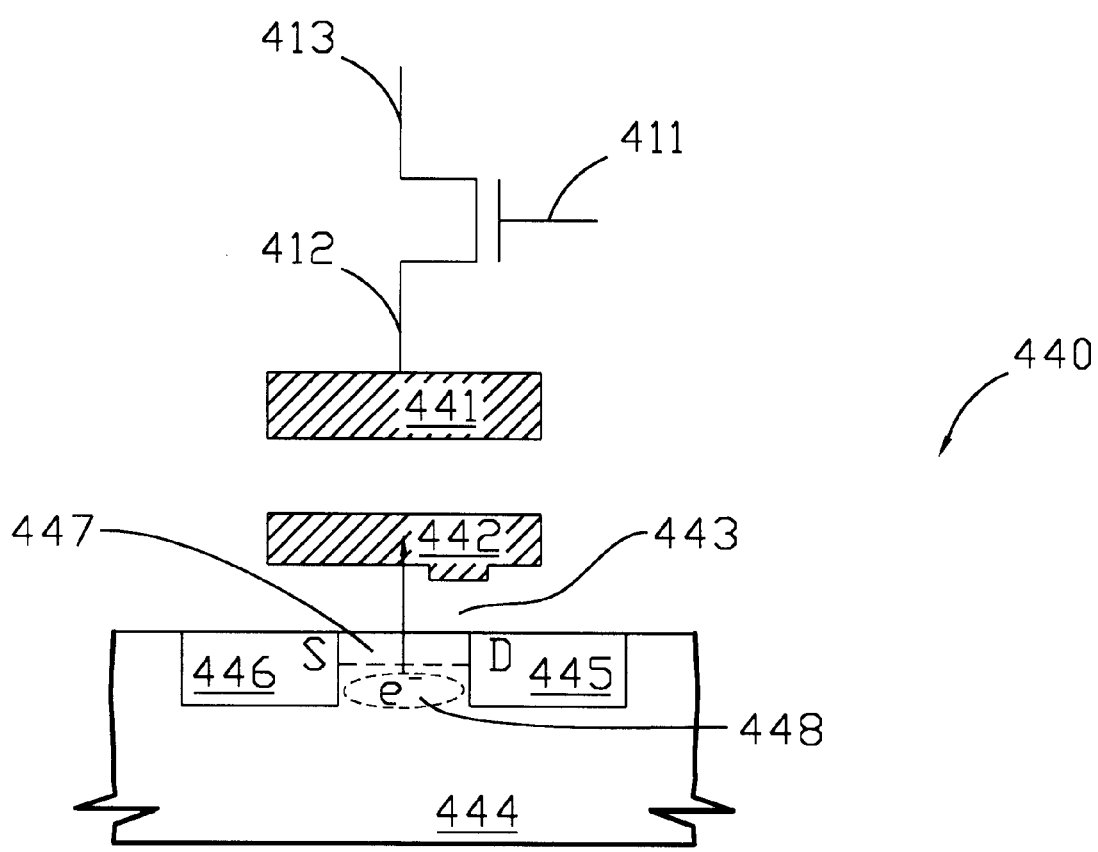
FIG. 4C shows a schematic cross-section of the vertical two-transistor memory cell programmed with positive voltage applied to the control gate and the select gate, and the source, drain and substrate grounded.

The memory cell 400 can be programmed by channel FN tunneling of electrons, as shown in FIG. 4C. In the programming of a memory cell 440, the control gate 413 and select gate 411 both are applied with a high positive voltage between about 15V and about 20V, the drain 445 and the source 446 are grounded or floating, and the substrate 444 is grounded. Such, the electrons can be injected from the substrate 444 through the channel 447 and tunnel oxide 443 into the floating gate 442. By means of controlling the word lines, the other memory cells connected to the same control line c(an avoid the loss of data caused by the high voltage. For example, when the cell 11 is programmed by the control line 1, as shown in FIG. 4B, the word line 1 is applied with a voltage, but the word line 2 is no voltage. Such, the cell 21 will not be affected by that high voltage, and the data stored in the cell 21 can be preserved. As a result, the vertical two-transistor memory cell provided by the present invention can avoid the word line disturb.

Figure 1A:
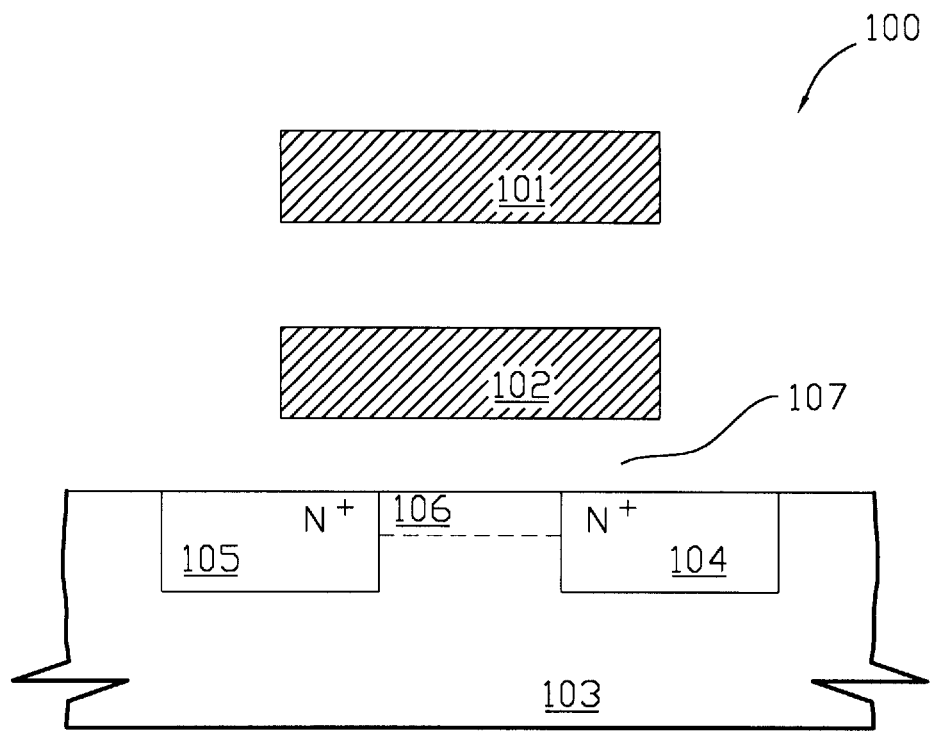
FIG. 1A shows a schematic cross-section of an EPROM.
Figure 1B:
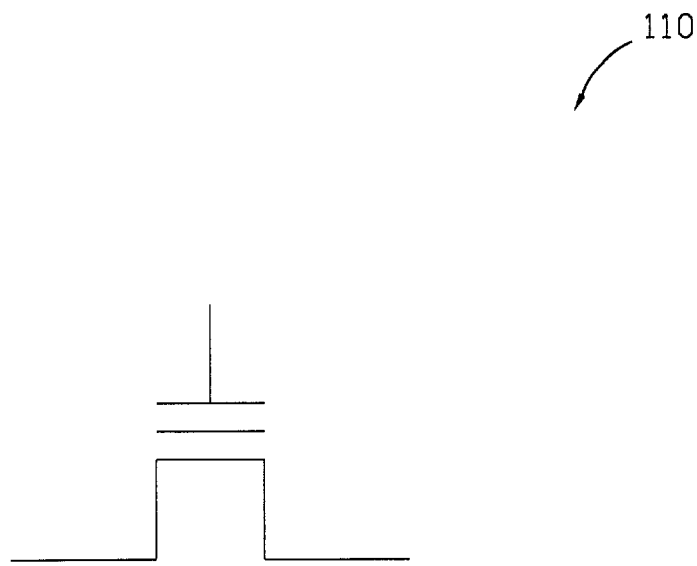
FIG. 1B shows an equivalent circuit diagram of an EPROM.
Figure 2A:
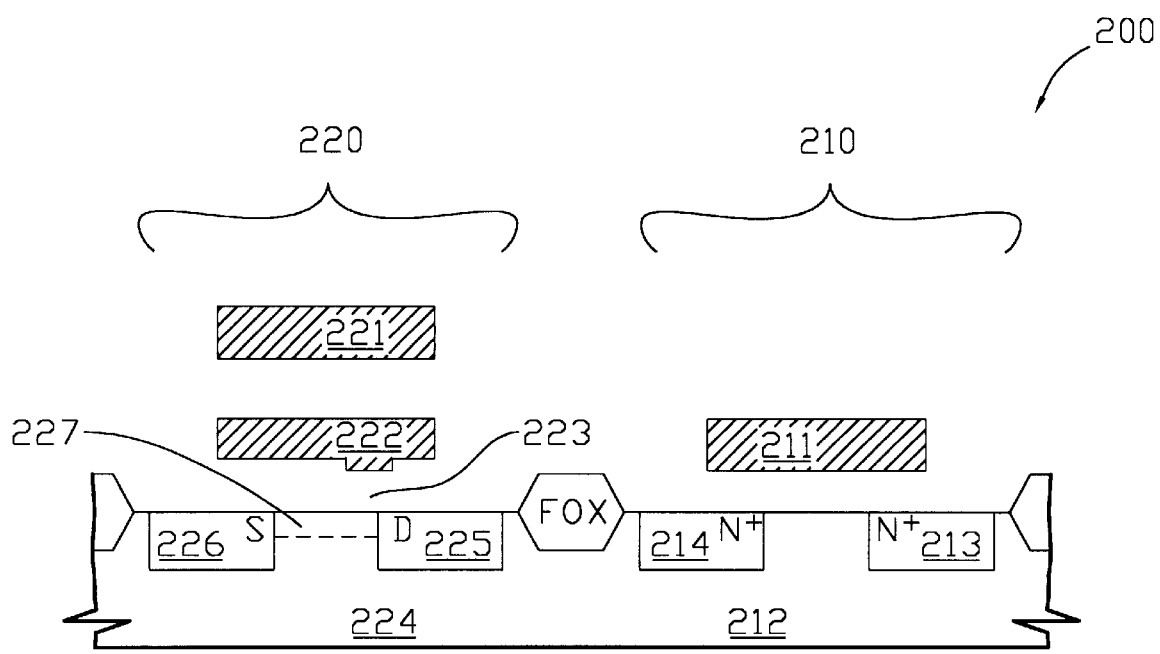
FIG. 2A shows a schematic cross-section of an EEPROM.
Figure 2B:
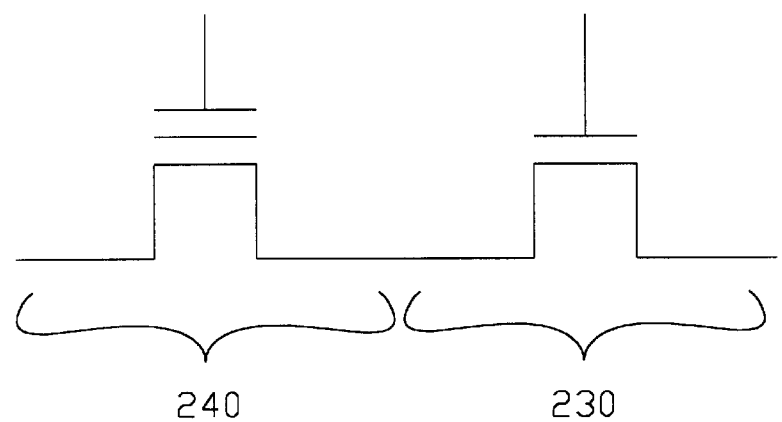
FIG. 2B shows an equivalent circuit diagram of an EEPROM.
Figure 2C:
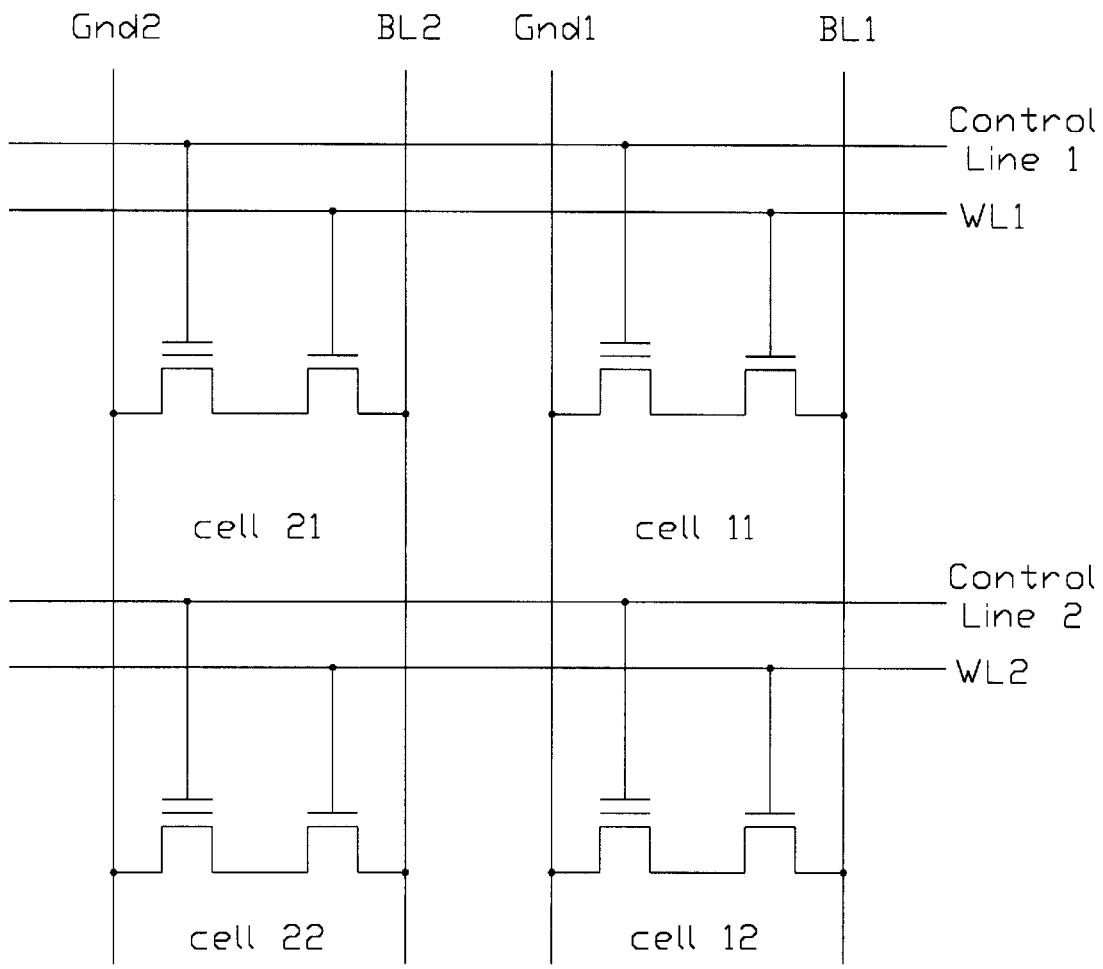
FIG. 2C shows a equivalent circuit diagram of EEPROM memory array.
Figure 2D:
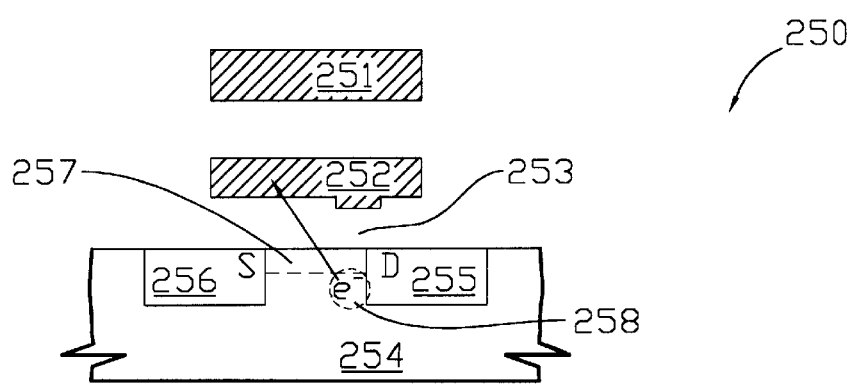
FIG. 2D shows a schematic cross-section of the storage transistor of an EEPROM programmed with positive voltage applied to the gate and negative voltage applied to the drain.
Figure 3A:
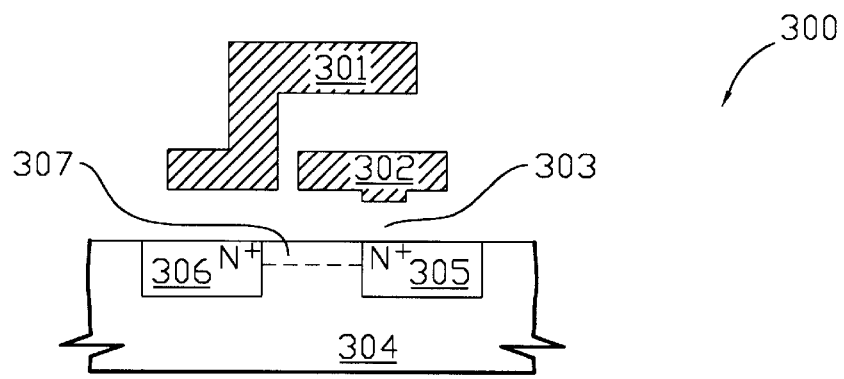
FIG. 3A shows a schematic cross-section of a split gate flash memory cell.
Figure 3B:
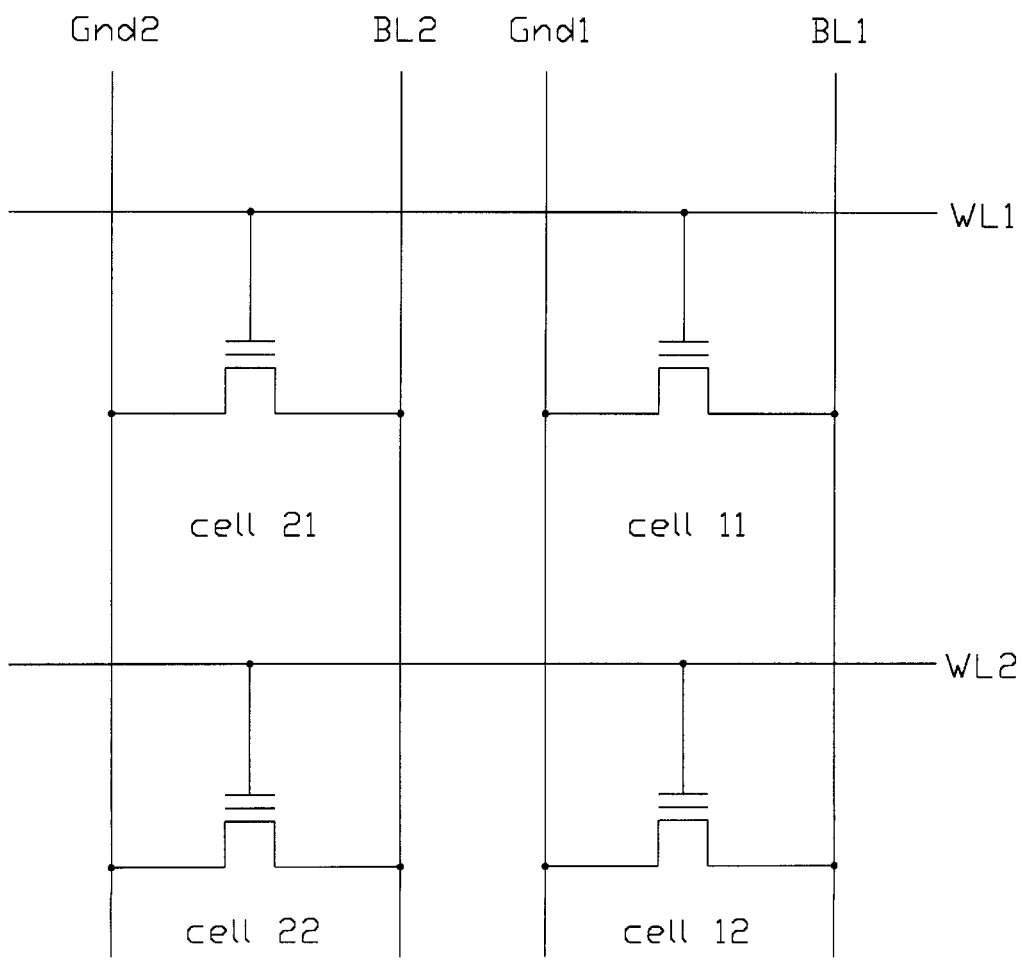
FIG. 3B shows an equivalent circuit diagram of split gate flash memory array.

Because a high voltage is applied to the control gate 413 and both the drain 445 and source 446 are grounded, one advantage of the channel FN tunneling programming is that the electrons are injected from a region 448, as shown in FIG. 4C, through the overall channel 447 to the floating gate 442. This is unlike the conventional programming in which the electrons are injected from a partial region 258, as shown in FIG. 2D, of channel near the drain and will cause overuse to the partial region 258 so that the function of the memory cell will degrade.

In addition, the vertical two-transistor memory cell can also be erased by channel FN tunneling. In erase mode the select gate 411 is applied with an adequate voltage, the control gate 413 is grounded, the source 446 and drain 445 are floating or applied a voltage equal to the voltage of well, and the substrate 444 is applied with a high voltage between about 15V and about 20V, so that the electrons stored in the floating gate 442 can be withdrawn through the tunnel oxide 443 and channel 447 to the substrate 444.

Furthermore, the vertical two-transistor memory cell can be also programmed by conventional methods such as hot electron injection and drain FN tunneling, and can be also erased by negative gate source erase or drain FN tunneling erase.

Although the vertical two-transistor memory cell in this embodiment consists of an NMOS and an ETOX, the NMOS can be substituted by a PMOS.

Although specific embodiments have been illustrated and described, it will be obvious to those skilled in the art that various modifications may be made without departing from what is intended to be limited solely by the appended claims.

What is claimed is:

1. A structure of memory cell, said structure comprising:
   an erasable programmable read only memory, wherein said erasable programmable read only memory which is acted as a storage transistor comprises a first control gate, a floating gate, a gate oxide, a channel, a substrate, a first source and a first drain; and
   an MOS transistor, wherein said MOS transistor which is acted as a select transistor comprises a gate, a second drain, and a second source, said gate acted as a select gate of said structure of memory cell, one of said second source and said second drain connected to said first control gate of said erasable programmable read only memory, the other acted as a second control gate of said structure.

2. The structure according to claim 1, wherein said gate oxide is a tunnel oxide.

3. The structure according to claim 1, wherein said MOS transistor is P-type.

4. The structure according to claim 1, wherein said MOS transistor is N-type.

5. The structure according to claim 1, wherein said memory cell can be programmed by channel Fowler-Nordheim tunneling.

6. The structure according to claim 1, wherein said memory cell can be erased by channel Fowler-Nordheim tunneling.

7. The structure according to claim 1, wherein programming methods for said memory cell comprise hot electron injection and drain Fowler-Nordheim tunneling.

8. The structure according to claim 1, wherein erasing methods for said memory cell comprise negative gate source erase and drain Fowler-Nordheim tunneling.

9. The structure according to claim 1, wherein said select gate is connected to a word line, said second control gate is connected to a control line, said first drain is connected to a bit line, and said first source is grounded.

10. A memory device, said device comprising:
   a plurality of memory cells, wherein said plurality of memory cells forms a memory array and each of said plurality of memory cells consists of an erasable programmable read only memory and a MOS transistor, said erasable programmable read only memory comprising a first control gate, a floating gate, a gate oxide, a channel, a substrate, a first source and a first drain, said MOS transistor comprising a gate, a second drain, and a second source, said gate acted as a select gate of said each of said plurality of memory cells, one of said second source and said second drain connected to said first control gate, the other acted as a second control gate of said each of said plurality of memory cells;
   a plurality of word lines, wherein each of said plurality of word lines is connected to said select gate of each of said plurality of memory cells which are arranged in the same column of said memory array;
   a plurality of bit lines, wherein said plurality of bit lines is connected to said first drain of said each of said plurality of memory cells which are arranged in the same column of said memory array; and
   a plurality of control lines, wherein said plurality of control lines is connected to said second control gate of said each of said plurality of memory cells which are arranged in the same row of said memory array.

11. The device according to claim 10, wherein said gate oxide is a tunnel oxide.

12. The device according to claim 10, wherein said MOS transistor is P-type.

13. The device according to claim 10, wherein said MOS transistor is N-type.

14. The device according to claim 10, wherein said plurality of memory cells can be programmed by channel Fowler-Nordheim tunneling.

15. The device according to claim 10, wherein said plurality of memory cells c(an be erased by channel Fowler-Nordheim tunneling.

16. The device according to claim 10, wherein programming methods for said plurality of memory cells comprise hot electron injection and drain Fowler-Nordheim tunneling.

17. The device according to claim 10, wherein erasing methods for said plurality of memory cells comprise negative gate source erase and drain Fowler-Nordheim tunneling.

18. A method for programming a memory cell, wherein said memory cell consists of an erasable programmable read only memory and a MOS transistor, said erasable programmable read only memory comprising a first control gate, a floating gate, a tunnel oxide, a channel, a substrate, a first source and a first drain, said MOS transistor comprising a gate, a second drain, and a second source, said gate acted as a select gate of said memory cell, one of said second source and said second drain connected to said first control gate, the other acted as a second control gate of said memory cell, said method comprising:
   applying a first voltage to said second control gate;
   applying a second voltage to said select gate;
   making said first source and said first drain be grounded or floating; and
   making said substrate be grounded.

19. The method according to claim 18, wherein said first positively voltage is between about 15V to about 20V, and said second positively voltage is between about 15V to about 20V.

* * * * *